United States Patent [19]

Martin

[11] Patent Number: 6,060,332
[45] Date of Patent: May 9, 2000

[54] HYBRID DEVICE WITH FLUSH-MOUNTED CONTACTS FOR GENERATING ACOUSTIC SIGNALS, AND METHOD FOR MAKING SAME

[75] Inventor: Philippe Martin, Beaune, France

[73] Assignee: Gemplus, Gemenos, France

[21] Appl. No.: 09/065,088

[22] PCT Filed: Oct. 25, 1996

[86] PCT No.: PCT/FR96/01668

§ 371 Date: Jun. 19, 1998

§ 102(e) Date: Jun. 19, 1998

[87] PCT Pub. No.: WO97/15899

PCT Pub. Date: May 1, 1997

[30] Foreign Application Priority Data

Oct. 26, 1995 [FR] France .................................. 95 12661

[51] Int. Cl.[7] ........................... H01L 21/00; H01L 21/44; H01L 23/02; H01L 23/34
[52] U.S. Cl. .............................. 438/25; 438/51; 438/107; 257/679; 257/724
[58] Field of Search ............................... 438/25, 51, 107; 257/679, 724

[56] References Cited

U.S. PATENT DOCUMENTS 5,418,688  5/1995  Hertz .

FOREIGN PATENT DOCUMENTS

0664633   of 1995  European Pat. Off. .
62-071359  of 1987  Japan .
92/20048  11/1992  WIPO .

Primary Examiner—David E. Graybill
Attorney, Agent, or Firm—Roland Plottel

[57] ABSTRACT

A process for manufacturing a hybrid card, and a hybrid card which functions as a smart card with flush contacts and/or produces acoustic signals which can be transmitted by telephone. The card includes a first sheet that has on one of its surfaces an interconnection pattern and electronic components, and through the body of the first sheet perforations for a double faced micro module (10). A second sheet is on an opposite face of the card. An intermediate sheet is between the other two sheets and has cut-outs (210, 215) in which are housed electronic components affixed to the first sheet, and has metal coatings (260) for making electrical connection to the micro module (10) and also to the interconnection pattern (110) on the first sheet (100).

20 Claims, 5 Drawing Sheets

HYBRID DEVICE WITH FLUSH-MOUNTED CONTACTS FOR GENERATING ACOUSTIC SIGNALS, AND METHOD FOR MAKING SAME

This invention relates to a hybrid device which can operate like a smartcard (microprocessor card) with flush contacts and/or for the production of acoustic signals which can be transmitted by telephone.

Such a device is very useful, in particular for the transfer of data over a telephone line, in encrypted form to a server for example, in a secure manner. Also data stored in its memory can be accessed by the use of an external reader.

The acoustic signals are produced in accordance with the data encoding principle, by a pair of frequencies between 697 and 1633 Hz, and are better known by the English name of DTMF (Dual Tone Modulation Frequency). In telephony, these DTMF signals are used for dialling, transmission of codes, etc.

At the present time, it is known how to create the DTMF signal production devices. Thus, patent application ES 95 470 001.9, for example, describes a DTMF signal production device of very low thickness which can be held in a wallet.

For their part, the smartcards with flush contacts are very well known nowadays, and are produced in large numbers. The are of very low thickness, standardised to some 0.8 mm.

On the other hand, no hybrid device of very low thickness has yet been produced which has a double use, namely as a smartcard with flush contacts and as a DTMF signal production device.

In fact, to contemplate combining at one and the same time the format constraints imposed by a very low thickness and these two distinct functions, in which the creation of a DTMF signal production device, presented an obstacle which was difficult to surmount without the inventive process of the applicant.

This invention therefore aims to supply a hybrid device which comes in the form of a card of very low thickness, capable of functioning as a smartcard with flush contacts and/or for the production of acoustic signals which can be transmitted by telephone. This device is mainly characterised in that it includes:

a first sheet, comprising the rear surface, bearing an interconnection pattern reserved for securing of the electronic components, and including a perforation suitable for the acceptance of a double-faced micromodule in such a manner that the metal contacts belonging to the first face, called the external face, of the micromodule, come flush with the lower face of the rear surface, and come into contact with an external reader in order to establish communication in the manner of a smartcard.

a second sheet comprising the front surface, and an insert sheet placed between these two sheets, comprising the cut-outs which are suitable for housing the electronic components fixed to the rear surface, together with the metal coatings used to make an electrical connection, firstly with the metal contacts belonging to the second face, known as the internal face, of the micromodule, and secondly with a circuit for the production of sound signals, by means of an interconnection pattern on the rear surface, in order to establish communication by means of acoustic signals which can be transmitted over a telephone line.

A conventional micromodule, having only a single face, is generally specified as being formed from a set of elements, notably composed of an integrated-circuit chip, metal contacts used as the point of contact of the micromodule with an external device, and protection formed from a resin covering the chip, the connecting wires linking the chip to the metal contacts, and partially the metal contacts.

In addition, although it is possible to reduce, in a known manner, the thickness of most of the electronic components, such as resistors, capacitors, integrated-circuit chip, sound transducer or battery, for example, to value below 0.8 mm, it is nevertheless very difficult to reduce the thickness of a resonator.

A resonator constitutes a time and frequency base, and is used to determine the two frequencies used for production of the DTMF signals. The thickness of a conventional resonator is of the ordeal of 1.6 mm, so that it is impossible to use it in a device with a thickness of some 0.8 mm. The expertise available from previous techniques do not recommend the use of a ceramic wafer alone as a resonator, because such a wafer is known to be fragile, not to hold its properties over time, and not to exhibit good reliability as a function of temperature. Up to the present, no satisfactory solution has been proposed for reduction of the thickness of a resonator to a value of less than 0.8 mm. The present invention enables this problem to be solved. In fact, in accordance with another characteristic of the invention, the resonator includes a piezoelectric ceramic wafer which is metal-coated on both faces, and electrically connected to two large capacitors by means of contact points forming part of an interconnection pattern.

This characteristic has a very great advantage in comparison with previous techniques, because in this case the thickness of the resonator is considerably reduced, and becomes less than 0.8 mm. The thickness of the resonator according to the invention also produces good results, which contradict received ideas from the previous techniques.

Another purpose of the invention relates to a process for the manufacture of such a hybrid device. This process is characterised in that it consists of:

creating, on a first sheet comprising the rear surface of the device, an interconnection pattern and a perforation of fixing the electronic components onto the interconnection pattern, of applying to the surface of the first sheet an insert sheet, on which surface metal-deposition has already been applied with a view to establishing electrical connections with the interconnection pattern. The said insert sheet also has cut-outs suitable for housing the electronic components fixed to the first sheet.

of placing a double-faced micromodule in a cavity formed by the perforation provided in the rear surface of the device and the lower face of the insert sheet, in such a manner that the metal contacts of its internal face are connected to the metalled surfaces of the insert sheet, so that the metal contacts on its rear external face come flush with the lower face of the rear surface of the device.

of affixing a second sheet, comprising the front surface of the device, onto the insert sheet.

Other special features and advantages of the invention will become apparent on reading the description, which is given as an illustrative, and no, limited, example referring to the appended figures which represent.

Figure 1A:
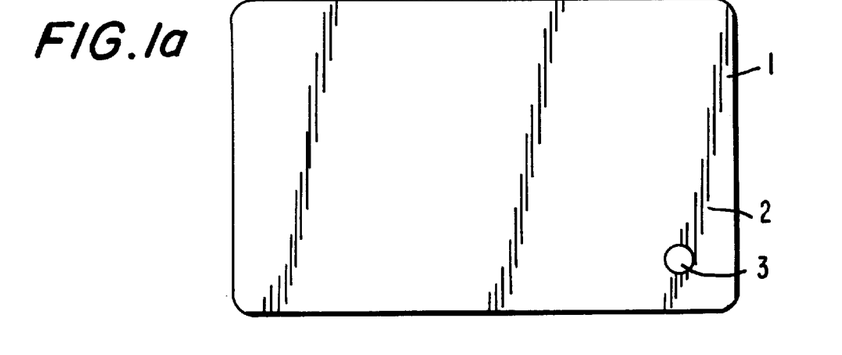
FIGS. 1a and 1b respectively: a top view and a bottom view of a device in accordance with the invention.

FIG. 1a represents a top view 2, meaning a view of the top face of the front surface of a device 1 in accordance with the invention. This front surface is flat. The device in accordance with the invention is created in the conventional format for smartcards, according to ISO standard 78.16-12, with a low thickness of the order of 0.8 mm. A key 3, when it is pressed, is used to advantage to trigger a circuit for the production of acoustic signals. However according to a variant not presented, it is possible to place such a triggering system on one of the longitudinal sides of the device.

Figure 1B:
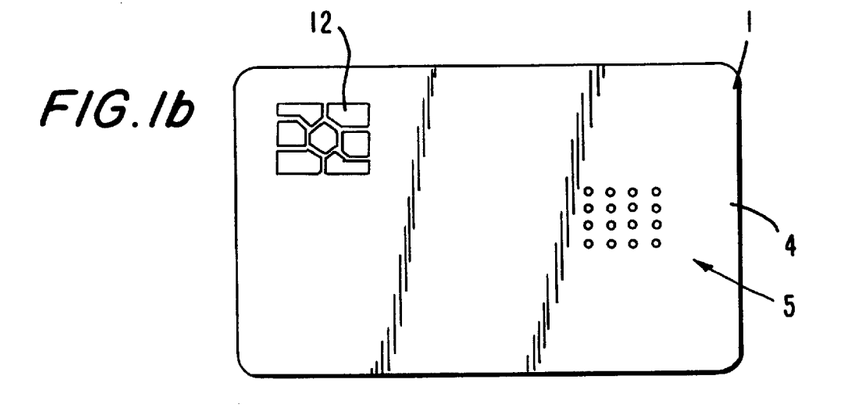

FIG. 1b show a bottom view 4 of this device 1, meaning a view of the lower face of the rear surface. This rear surface includes small holes 5 used to facilitate the acoustic emission of the DTMF signals. In addition, metal contacts 12 of a built-in micromodule come flush with the rear surface 4 of the device 1.

Figure 2:
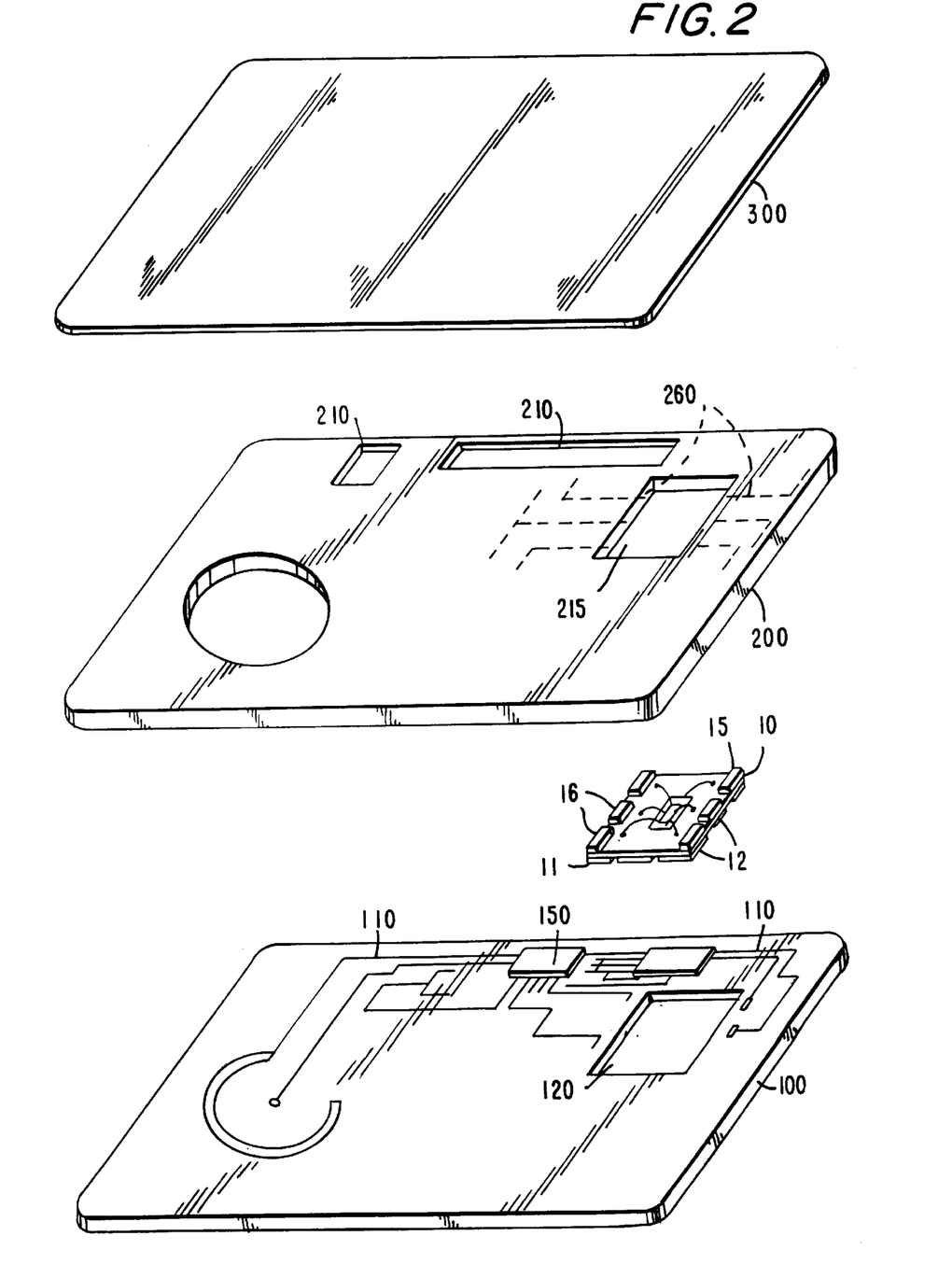
FIG. 2: an exploded and simplified view of a device in accordance with the invention.

FIG. 2 illustrates, in a simplified manner, the internal structure of a device in accordance with the invention. This device consists of at least three parts stacked one upon the other. A first sheet comprising the rear surface 100, an insert sheet 200 and a second sheet comprising the front surface 300. The rear surface 100 supports, on its top face, an interconnection pattern 110 used for fixing of electronic components, such as a circuit for the production of acoustic signals coupled to a sound transducer, a resonator and a battery, for example. The spaces corresponding to these electronic components are outlined by the interconnection pattern 110. Only the acoustic signal production circuit is shown on FIG. 2, by a container referenced as 150. In addition, the rear surface includes a perforation 120 suitable for accepting a double-face micromodule 10 in such a manner that the metal contacts 12 constituting the first face, called the external face 11, of this micromodule comes flush with the lower face of the rear surface. The flush contacts 12 are therefore able to come into contact with an external reader in order to establish communication in the manner of a smartcard.

The insert sheet 200 is affixed to the rear surface, and includes cut-outs 210 used to house the electronic components intended to be fixed to the interconnection pattern on the rear surface. Another cut-out 215 is also provided in this insert sheet in such a manner as to house part of the micromodule 10 covered with a protective layer not shown in FIG. 2. The dimensions of this cut-out 215 are less than those of the perforation 120 located on the rear surface. Furthermore, the lower face of the insert sheet includes metal tracks 260, represented by dotted lines on FIG. 2, which are used to make an electrical connection firstly with the metal contacts 16 comprising the second face, known as the internal face 15 of the micromodule 10, and secondly with the interconnection pattern 110 of the rear surface 100. These metal tracks 260 on the insert sheet are therefore used to connect the internal face 15 of the micromodule 10 electrically to the DTMF signal production device 150 in the interconnection pattern 110, in order to establish communication by means of acoustic signals which can be transmitted by telephone. The electrical connection between the metal tracks 260 of the insert sheet and the interconnection pattern 110 of the rear surface is created to advantage by means of an anisotropic adhesive conductor.

Finally, the second sheet, comprising the front surface 300 covers the insert sheet 200, and closes the device.

Figure 3:
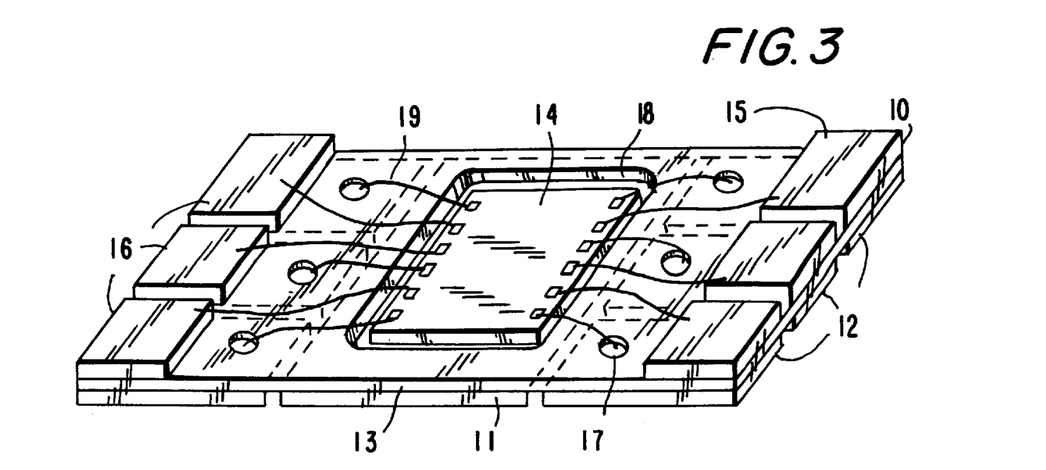
FIG. 3: a double-face micromodule FIGS. 4a, 4b and 4c respectively: a resonator in exploded form; in assembled form, and section BB.

The double-face micromodule 10, incorporated into the device of FIG. 2, will be better understood by looking at FIG. 3. To simplify the representation in FIG. 3, the metal contacts of the micromodule are represented in the form of squares. The metal contacts 12 on the external face 11 constitute an intermediate connector, created using a conventional process, by means of a sheet of copper onto which is fixed, by adhesion for example) a dielectric sheet 13. The dielectric sheet 13 includes a set of holes 17, the positioning of which correspond to the placing of the contacts 12, and a central hole 18, for the positioning of an integrated circuit chip 14. The chip 14 is connected to the metal contacts 12 of the external face 11 in copper, by means of wires 19, using a well-known technique called "bonding", through the holes 17 created in the dielectric sheet 13.

In addition, other metal contacts 16 in copper, defining the internal face 15, are fixed, by adhesion for example, to the dielectric sheet 13, on either side of the chip 14. In the same manner as previously described, the chip 14 is connected to the contacts 16 by means of wires 19 using the "bonding" technique. Finally, a protective layer, not shown, formed from a resin, is placed so that it covers the chip 14, the connecting wires 19 and partially the metal contacts 16 of the internal face 15.

The creation of a hybrid device in accordance with the invention, in such a manner that the thickness is equal to that of a smartcard, that is equal to 0.8 mm, requires that the thickness of the electronic components inserted into it are less than 0.8 mm. Nowadays, it is relatively easy to reduce the thickness of components such as capacitors, resistors, batteries, chips or sound transducers for example. In fact, thicknesses of around 0.3 mm are being achieved currently for capacitors and batteries, and up to 0.08 mm for sound transducers in ceramic, and even of 180 $\mu$m (micrometers) for integrated circuits.

However it is very difficult to reduce the thickness of a resonator, which in general is equal to about 1.6 mm. Up to the present, everything seemed to go against the use of a single wafer of piezoelectric ceramic, because such a wafer is thought to be very fragile, not to keep its properties over time, and not to achieve good reliability as a function of temperature. Now it turns out in fact, in a somewhat surprising manner, that such a wafer offers good results.

Figure 4A:
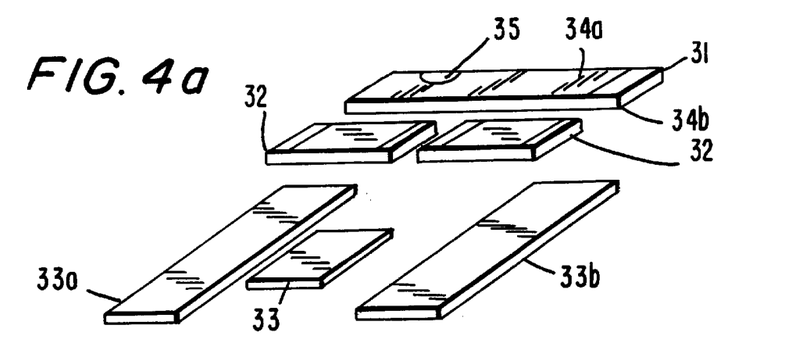
Figure 4B:
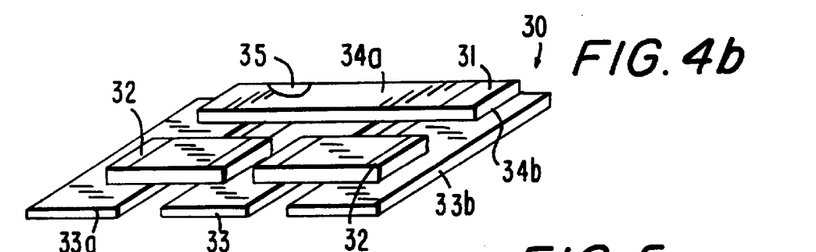
Figure 4C:
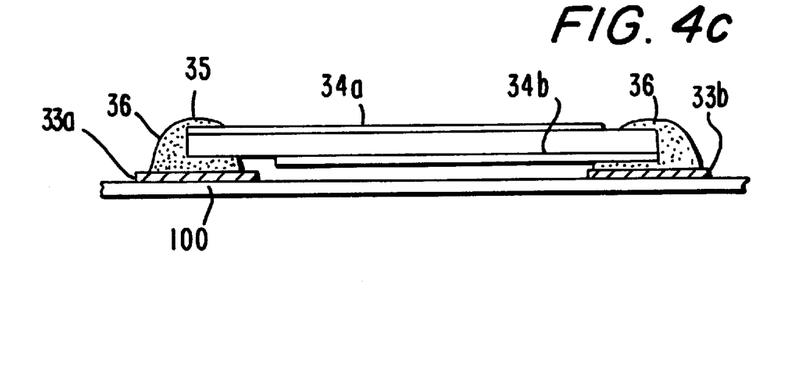

Thus the resonator 30 of a hybrid device created in accordance with this present invention, consists of a single wafer of piezoelectric ceramic 31, including metal tracks 34a and 34b on its two faces, as shown in FIGS. 4a, 4b and 4c in an exploded view, assembled, and in section B—B. The metal track 34a and 34b defines the two lower and upper electrodes. The wafer 31 is fixed, by adhesion (gluing) for example, onto contact points 33a and 33b of the interconnection pattern 110 created on the rear surface 100 of the device. The adhesion can be achieved with advantage using a conducting adhesive 36. In addition, two capacitors 32 also with metal elements at their two ends, are electrically connected to each other and to each face of the ceramic wafer 31, by means of contact points 33, 33a and 33b of the interconnection pattern. These capacitors are also fixed by gluing, using a conducting adhesive 36.

The upper and lower metal connections, 34a and 34b of the wafer 31 can be separated from each other with advantage, as represented in FIG. 4c. This enables the ceramic wafer to be supported on two contact points, 33a and 33b, and each metal connection to be linked separately to a contact point.

Preferably, the metal contact 34a on upper face of the wafer 31 is connected to a first contact point 33a by means of conducting adhesive 36 placed both on a point 35 of the metal contact 34b and on the contact point 33a, and the metal contact 34b on lower face of the wafer 31 is connected to a second contact point 33b by means of this same conducting adhesive 36.

Such a resonator has a considerably reduced thickness, being of the order of 0.3 mm, and consequently can be easily incorporated into a hybrid device produced in accordance with the invention, the thickness of which is around 0.8 mm.

Figure 5:
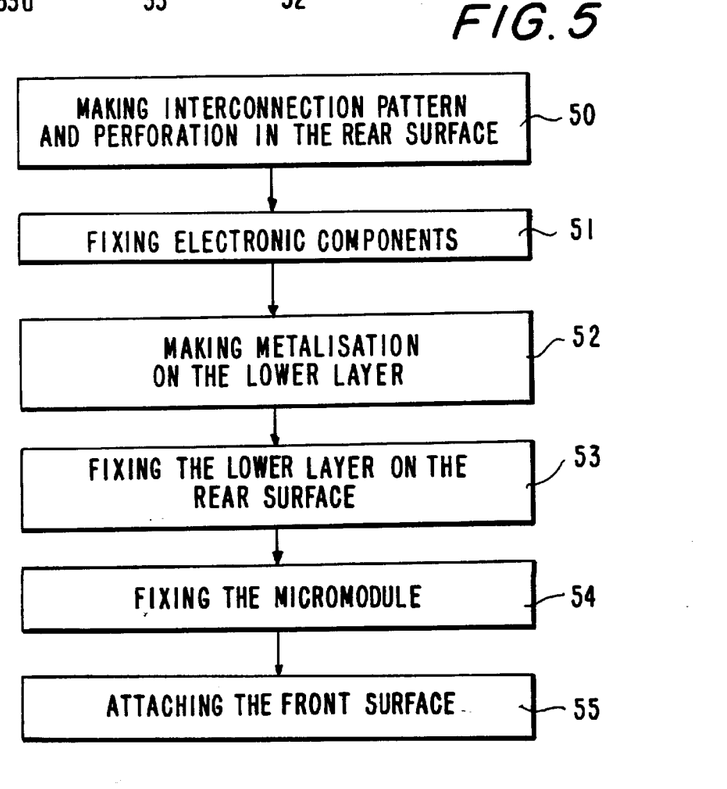
FIG. 5: a flow chart representing the stages of the manufacturing process of a device in accordance with the invention.

A manufacturing process for a device in accordance with the invention will be better understood by looking at the flow chart in FIG. 5. A first stage 50 of this process consists of the creation, using silk-screening with conducting ink, or by evaporation, or by any other process of metal deposition, of the interconnection pattern 110 on the rear surface 100 of the device, and the creation of a perforation in this rear surface in a manner which allows the double-faced micromodule of FIG. 3 to be housed in it.

In a second stage 51, electronic components, necessary for the operation of the device, are fixed onto the interconnection pattern at the positions reserved for the purpose. They should preferably be fixed by gluing, by means of a conducting adhesive for example.

In stage 52, the metallic surfaces 260 are created on the lower surface of the insert sheet 200, which is then fixed (stage 53), by hot gluing under pressure for example, onto the rear surface 100 of the device. The double-face micromodule 10 is then placed in a cavity formed by the perforation in the rear surface and the lower face of the insert sheet, representing stage 54. Installation of the micromodule will be explained in more detail below. Finally, the last stage 55 consists of affixing onto the insert sheet the sheet constituting the front surface 300.

Figure 6:
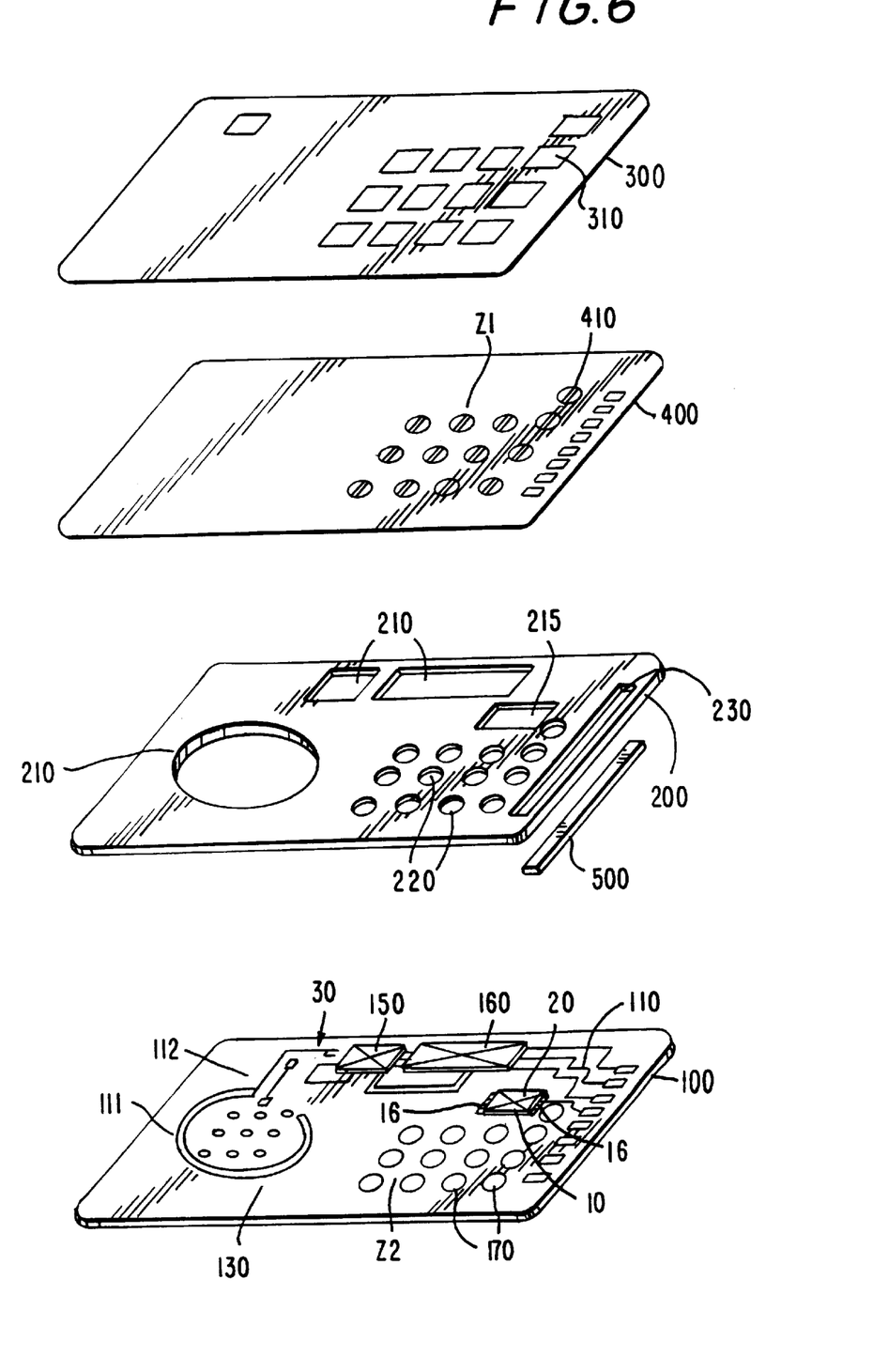
FIG. 6: an exploded view of a device in accordance with the invention.

FIG. 6, which is an exploded view of a device in accordance with the invention, provides a better understanding of the details of its structure and of its manufacturing process. This device is composed of several parts 100, 200, 300 and 400 stacked one on top of the other, and a double-face micromodule 10, as described previously.

Advantageously, the upper face of the first sheet 100 includes an interconnection pattern 110 which is reserved for fixing of the electronic components, a perforation, not shown in FIG. 6, used to house the micromodule 10, and several small holes 130 designed to facilitate the emission of DTMF acoustic signals. The interconnection pattern 110 is created, for example, by silk screen printing with conducting ink, or by evaporation, or by any other conventional process of metal deposition. All of the electronic components necessary for the operation of this device, are made up from the circuit 150 for the production of acoustic signals, coupled to a sound transducer, not shown in FIG. 6, a resonator 30, a battery 160, the micromodule 10, and other passive components not shown in FIG. 6. The positioning of the sound transducer on the rear surface 100 is delimited by a first electrode 112 and a second circular electrode 111, the interconnection pattern 110, surrounding the small holes 130. The internal face of the micromodule 10 in FIG. 3 is shown in FIG. 6 with a protective layer 20 covering the chip, the connecting wires, and partially the metal contacts 16. The thickness of the rear surface 100 should preferably be of the order of 0.2 mm.

The insert sheet 200 has a relatively greater thickness than that of the rear surface, being between 0.4 mm and 0.5 mm, and includes cut-outs 210 which are suitable for accommodation of the electronic components which are fixed onto the interconnection pattern 110 of the rear surface, and a cut-out 215 which is suitable for accommodating the part of micromodule 10 covered with the protective layer 20. The material of which this insert sheet is composed should preferably have a high degree of mechanical stiffness. It is therefore manufactured from a thermoplastic material loaded with glass needles and/or balls. In addition, this insert sheet 200 includes, on its rear surface, metal depositions, not shown in FIG. 6, used to create an electrical connection with the interconnection pattern 110 on the rear surface, and a connection to the metal contacts 16 of the internal face 15 of the micromoodule 10.

The second sheet 300 covers the insert sheet 200, to form the front surface of the device.

The resonator 30 described above, is advantageously affixed to the interconnection pattern 110 of the rear surface, by means of a conducting adhesive. Furthermore, it is positioned in such a manner that its length is oriented across the width of the device, in order to prevent the stresses caused by twisting across the width of the device from leading to breakage of the ceramic piezoelectric wafer 31.

In order that it can function however, it is also necessary that the resonator be placed in such a manner that there is air on either side of it. As a result, a small cavity is created on one side by the thickness of the metal deposition of the interconnection pattern 110, which is of the order of a few tenths of a micrometer ($\mu$m), and a larger cavity is created on the other side by the thickness of the insert sheet reduced by the thickness of the resonator. In addition, the corresponding cut-out provided in the insert sheet, in order to accommodate it, is also used to provide a very effective mechanical protection for this resonator, as if it were contained in a case.

The rear surface 100 and the insert sheet 200, constitute the body of the device. This body is created to advantage by cutting out with a laser or by hydro-cutting.

A production variant, also shown in FIG. 6, consists of placing a keyboard in the hybrid device in accordance with the invention. To this end, an additional sheet 400 is placed between the front surface 300 and the insert sheet 200. This additional sheet 400 constitutes a first contact zone (Z1 and supports contact studs 410 necessary for creation of the keyboard. These contact studs are created, for example, by silk screen printing or by any other deposition technique, and are made up from a conducting polymer. In an advantageous manner, the studs 410 this deposited have a thickness which is slightly less than that of the insert sheet 200, that is between 0.3 and 0.4 mm.

In this case, the upper face of the rear surface 110 constitutes a second contact zone Z2 on which metal contact points 170 are created by silk screen printing or by any other deposition process. Furthermore, additional cut-outs 220 are made in the insert sheet 200, at the positions of the contact studs 410.

In this way, the contact studs 410 are positioned opposite to the contact points 170 through the cut-outs 220 in the insert sheet. The contact studs 410 of Z1 each comprise two half-disks or lines in the form of interdigital combs for example, while the contact points 170 of Z2 are round or square. The establishment of the keyboard contacts is then achieved by simple pressure on the contact studs 410, through the front surface, so as to make electrical contact between the half disks 410 of Z1, forming a short circuit by simple pressure on contact points 170 of Z2. In addition, the two contact zones Z1 and Z2 of the keyboard are electrically connected at the interconnection pattern 110 of the rear surface 100, by means of an anisotropic conducting polymer 500 which is located in a cut-out 230 in the insert sheet.

Moreover, a graphic representing the location of the keys 310 of the keyboard is created to advantage, by silk screen printing for example, on the upper face of the front surface 300 of the device. Consequently, the second sheet 300 constituting the front surface and/or the additional sheet 400 are composed of a plastic material which is suitable for easy silk screen printing, such as a polyester or a polycarbonate for example.

Another variant, not shown, consists of placing a system for triggering the circuit 150 for the production of acoustic signals in the thickness of the insert sheet, and on one of the longitudinal sides of the device. This facilitates the use of the device. The system should preferably be placed on the right side for right-handed people and/or on the left hand for left-handed people. There are several types of triggering system available, and suitable for insertion in the hybrid device in accordance with the invention. In fact it could be an electromechanical system which can be used to establish a contact necessary for triggering a sequence of DTMF signals, by operation of a button or a lever for example. It could also be an electronic system, such as a sensitive switch for example, in which a metal plate, the thickness of which is identical to that of the insert sheet, leads the signals captured by the human body to the inputs of the CMOS circuits, which amplify them in order to establish an output in the high state or the low state, then used as the trigger. It is also possible to use a material in fluoridated polyvinylidene (FPVD) which is able, when compressed, to produce a triggering voltage for a circuit 150 suitable for generating a sequence of DTMF signals.

According to another production variant, not shown, it is also possible to deposit, onto the interconnection pattern, a small light-emitting diode (LED) which comes on when it is activated by the triggering system. This diode then becomes a visual signal to indicate the correct triggering of the acoustic signal production circuit. A small hole, of the order of 1 mm in diameter, is then made in the insert sheet and in the front surface of the device, to allow passage of the light from the diode.

Figure 7:
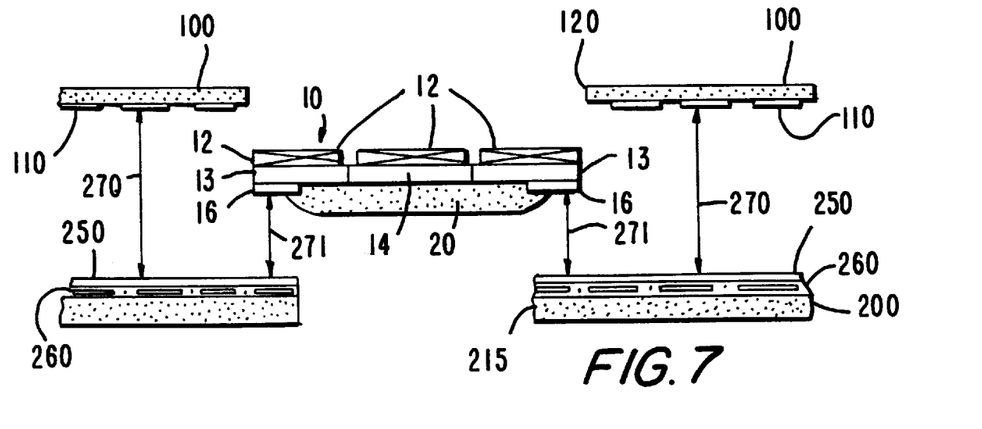
FIG. 7: a lateral section and exploded view of the micromodule of FIG. 3, fixed into a device in accordance with the invention.

FIG. 7 provides a better understanding of the manner in which the double-face micromodule is fixed in the hybrid device in accordance with the invention. In fact it represents a lateral sectional and exploded view of the micromodule 10 of FIG. 3, placed in the device of FIG. 6. The micromodule is placed in a cavity formed by the perforation 120 created in the rear surface 100 and by the lower face if the insert sheet 200.

The perforation 120 is created in the rear surface 100 for the purpose of placing the micromodule 10 in such a manner that the metal contacts 12 of its external face come flush with the lower face of the rear surface 100.

The rear surface 100 and the insert sheet 200 are assembled to advantage by hot gluing under pressure, that is at about 100° C. For this, and before proceeding to hot pressurisation, and adhesive film 250 loaded with low melting point metal balls for example, is placed between the insert sheet 200 and the rear surface 100. The purpose of this adhesive is not only to affix the insert sheet 200 to the rear surface 100 but also to electrically connect the metal deposit 260 created on the lower face of the insert sheet, with the interconnection pattern 110 of the rear surface. The electrical links thus created are referenced by the number 270 in FIG. 7.

Preferably, the number of metal deposits 260 created on the lower face of the insert sheet 200 is identical to the number of metal contacts created on the internal face of the micromodule. In a production variant however, this number can be smaller. A cut-out 215 is provided in the insert sheet 200 in such a manner that it will accommodate the part of the micromodule 10 which is covered with a protective layer 20 such as resin.

The micromodule is fixed in its cavity in such a way that the metal contacts 16 of its internal face are electrically connected to the metal deposits 260 of the insert sheet. The electrical connections thus created are designated by reference 271 in FIG. 7. To this end, the micromodule is fixed by means of the anisotropic conducting adhesive 250 which is deposited either in the perforation 120 created in the rear surface 100 that is on the metal deposits 260 of the insert sheet, or on the metal contacts 16 of the internal face of the micromodule. The metal deposits 260 are consequently used to electrically connect the metal contacts 16 of the internal face of the micromodule 10 to the acoustic signal production circuit fixed to the interconnection pattern 110, in order to establish a call by means of DTMF signals.

Figure 8:
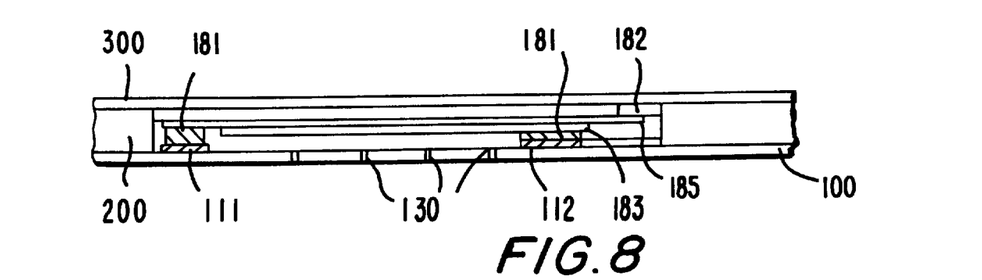
FIG. 8: a lateral section view of a sound transducer placed in a device in accordance with the invention.

FIG. 8 shows the way in which a sound transducer 180 is installed in the hybrid device of FIG. 5.

The sound transducer 180 is glued, by means of an anisotropic conducting adhesive 181 or by means of a polymer loaded with metallic needles oriented in the Z axis, that is on a vertical axis and perpendicular to the rear surface 100 of the device, in order to provide anisotropic conduction between the circular electrode 111 of the interconnection pattern 110 and the lower electrode of the transducer 180.

In the case where the electrical connection is established by means of a polymer loaded with metallic needles, a washer 182 is place into the upper metal electrode 185 of the transducer 180 in such a way as to allow an electrical contact between the electrodes of the transducer and the two contact points 111 and 112, of the interconnection pattern 110, reserved for placement of the transducer.

A small cavity 183 is made to advantage between the transducer and the front surface 300 of the device. This cavity has a small thickness of between 20 and 80 $\mu$m. This very low thickness is nevertheless sufficient to allow the sound transducer to function correctly. Another cavity 184 of greater thickness, constituting an acoustic chamber, is created between the upper face of the rear surface 100 of the device and the transducer 180. The thickness of this cavity 184 is between 0.15 and 0.3 mm. The small holes 130 made in the rear surface 100 are used to facilitate acoustic the emission of the DTMF signals.

According to a production variant, it is also possible to mount the transducer on the lower face of the front surface, using the same anisotropic adhesive. In this case however, the interconnection pattern 110 is created in an additional sheet placed between the front surface 300 and the insert sheet 200, as for example on the sheet 400 supporting the contact studs 410 necessary for creation of the keyboard.

What is claimed is:

1. A hybrid device in the form of a card of very low thickness, suitable for operation like a microprocessor card with flush contact and/or to produce acoustic signals which can be transmitted over the telephone, characterized in that it includes:

a first sheet, comprising the rear surface (100) of the device and, bearing on an upper internal face an interconnection pattern (110) for securing electronic components, including an acoustic signal circuit (150), and including a perforation (120) suitable for acceptance of a double-faced micromodule (10) in such manner that metal contacts (12) on a first external face (11) of the micromodule comes flush with a lower external face of the rear surface (100), whereby, to come into contact with an external reader in order to establish communication in the manner of the card, a second sheet comprising the front surface (300) of the device, and an insert sheet (200) placed between the sheets, including cut-outs (210, 215) which are suitable for housing the electronic components secured to the rear surface (100, and metal coatings (260) making electrical connections, firstly with metal-contacts (16) belonging to a second internal face (15) of the micromodule (10), and secondly with the circuit (150) for the production of sound signals, by the interconnection pattern (110) on the rear surface, in order to establish a telephone call.

2. A device in accordance with claim 1, characterised in that it also includes a resonator (30) comprising a ceramic piezoelectric wafer (31) with metalling on both of its faces, electrically connected to two capacitors (12) by means of contact points (33a and 33b) of the interconnection pattern (110).

3. A device in accordance with claim 2, characterized in that the thickness of the resonator (30) is 0.30 mm.

4. A device in accordance with claim 1, characterized in that the insert sheet (200) is composed of a thermoplastic material loaded with glass needles and/or balls.

5. A device in accordance with claim 1, characterized in that the insert sheet (200) has a thickness between 0.4 and 0.5 mm.

6. A device in accordance with claim 1, characterized in that the first sheet (100) has a thickness of about 0.2 mm.

7. A device in accordance with claim 1, characterized in that it also includes an additional sheet (400), placed between the front surface (300) and the insert sheet (200), constituting a first contact area (Z1) supporting contact studs (410) for a keyboard, and the rear surface (100) constitutes a second contact area (Z2) supporting contact points (170) for said keyboard.

8. A device in accordance with claim 7, characterized in that the second sheet (300) and/or the additional sheet (400) are composed of a plastic material suitable for easy silk screen printing.

9. A device in accordance with claim 8, characterised in that the second sheet (300) and/or the additional sheet (400) are composed of polyester or polycarbonate.

10. A device in accordance with claim 7, characterized in that the contact studs (410) on the additional sheet (400), are a conducting polymer material.

11. A device in accordance with claim 7, characterized in that the contact studs (410) on the additional sheet (400) have a thickness of between 0.3 and 0.4 mm.

12. A device in accordance with claim 1 characterized in that it also includes, on one of the its longitudinal sides and in the thickness of the insert sheet (200), a system for triggering of the acoustic signal circuit (150).

13. A device in accordance with claim 12, characterised in that the triggering system is an electromechanical system or an electronic system, or formed from a material which is able to produce a triggering voltage when it is compressed.

14. A manufacturing process for a hybrid device according to claim 1 comprising the steps of:

creating, on the first sheet comprising the rear surface (100) of the device, the interconnection pattern (110) and the perforation (120), fixing the electronic components onto the interconnection pattern (110), applying on the first sheet the insert sheet (200), on which a surface metal-coating (260) has already been applied on its lower face for establishing electrical connections with the interconnection pattern (110), making in said insert sheet (200) cut-outs (210, 215) for the electronic components fixed to the first sheet (100), placing the double-faced micromodule (10) in the cavity formed by the perforation (12) provided in the rear surface (100) of the device aid the lower face of the insert sheet (200), in such a manner that the metal contacts (16) of its internal face (15) are connected to the metalled surfaces (260) of the insert sheet (200), and so that the metal contacts (12) on its external face (11) come flush with the lower face of the rear surface (100) of the device, affixing the second sheet, comprising the front surface (300) of the device, onto the insert sheet (200).

15. A process in accordance with claim 14, characterized in that the micromodule (10) is fixed by an anisotropic conducting adhesive which is deposited either on metal deposits (260) of the insert sheet (200) or on the metal contacts (16) of the internal face (15) of the micromodule.

16. A process in accordance with claim 14, characterized in that the rear surface (100) of the device and the insert sheet (200) are assembled by hot gluing under pressure, using an adhesive film loaded with medal balls with low melting point, so as to electrically unite the metal elements (260) of the insert sheet (200) with the interconnection pattern (110).

17. A process in accordance with claim 14, characterized in that a resonator (30) is placed on the interconnection pattern (110) of the rear surface (100) with its length oriented along the width of the device.

18. A process in accordance with claim 14, characterized in that the rear surface (100) and the insert sheet (200) perforation and cut-outs are cut out by means of a laser or by hydro-cutting.

19. A process in accordance with one claim 14, further characterized by attaching an additional sheet (400) between the front surface (300) and the insert sheet (200), and, creating contact studs on this additional sheet, creating contact points (170) on the rear surface (100) and making keyboard cut-outs (220) in the inset sheet (200), so that the contact studs (410) and contact points (170) are positioned opposite to each other through the cut-outs (220) of the insert sheet to form a keyboard.

20. A process in accordance with claim 19, characterized by placing a system for triggering of the acoustic signal circuit in the thickness of the insert sheet (200) and on the longitudinal sides of the device.

* * * * *